Dec. 1, 1959 H. TYZACK 2,914,953

PRESET TUNING SELECTOR

Filed Feb. 3, 1958 3 Sheets-Sheet 1

INVENTOR.

Harald Tyzack

BY Mueller & Aichele

Atty.

INVENTOR.
Harold Tyzack
BY
Mueller & Aichele
Attys.

INVENTOR.
Harald Tyzack
BY Mueller & Aichele
Attys.

United States Patent Office 2,914,953

Patented Dec. 1, 1959

2,914,953

PRESET TUNING SELECTOR

Harold Tyzack, Schiller Park, Ill., assignor to Motorola, Inc., Chicago, Ill., a corporation of Illinois Application February 3, 1958, Serial No. 713,022

7 Claims. (Cl. 74—10.52)

This invention relates to control apparatus for use in the tuning of electronic equipments such as television receivers, and more particularly to apparatus for automatic tuning of television receivers to preset tuning settings, with a two speed drive for use in the manual presetting of the tuning apparatus.

The tuning of radio and television receivers is commonly controlled by the rotation of a shaft operatively connected to coils, condensers, or similar tuning means. Since the entire tuning range of the device may be limited to the rotation of the shaft through 360°, the difference between adjacent settings for reception of different signals is quite small where a large number of different signals are to be received. For example, in the tuning of a television receiver in the UHF range, it is often necessary to reproduce a given angular rotation of a tuning shaft within less than a degree. With approximately 80 different UHF channels to be received within a rotational range of 360° of the tuning shaft, very accurate tuning is necessary to provide the desired reception.

In a television receiver employing automatic or remote control tuning, the tuning shaft is driven by a motor which is adapted to be stopped after it has rotated the shaft to a predetermined position corresponding to a selected tuning setting. Because of the different frequencies or channels available in various areas in which television receivers are used, it is desirable that the desired settings may be tuned in manually in order to obtain the desired adjustment, and then the selector device used in conjunction with the receiver may be set so that the amount of rotation of the tuning shaft required to obtain the desired setting can be accurately reproduced. In order to provide accurate manual positioning of the tuning shaft as well as for its rapid rotation from one position to another, it is desirable that means be provided which enable the shaft to be rotated rapidly for coarse tuning but very slowly during the final fine adjustment. It is also desirable that the slowing down of the speed of rotation of the tuning shaft be accomplished without the addition of substantial frictional drag. More accurate tuning is accomplished if the tuning shaft itself is arranged to rotate at a slower rate than the knob or dial which is manually manipulated to turn it.

An object of the present invention is to provide control means for the tuning of a television receiver or the like which enables a desired tuning setting to be accurately selected and subsequently accurately reproduced.

Another object of the invention is to provide a tuning selector which is capable of very accurate adjustment so that a number of tuning settings which may be relatively close to one another may be accurately reproduced.

A further object of the invention is to provide manual tuning means for accurately setting a tuning shaft in a desired angular position prior to the setting up of automatic selector means for the subsequent reproduction of that position.

A feature of the invention is the provision of a two-speed drive for manually setting a tuner shaft in a desired position prior to setting a selecting mechanism for duplicating the position, which drive includes a sun gear and planetary gears operatively coupled to the tuner shaft by cooperating balls and camming surfaces enabling the gearing arrangement to be disengaged from the shaft after rotation thereof for a predetermined distance at a reduced speed so that faster rotation may be obtained and which will automatically reengage the shaft to permit slow rotation thereof when the direction of rotation is reversed thus enabling the shaft to be positioned accurately.

Another feature of the invention is the provision of a tuner having a shaft with a plurality of notched rings positioned along the shaft and each ring adapted to be rotated by the shaft. Each ring bears against a ball and holds it into contact with a switch blade until the notch in the edge of the ring is brought into alignment with the ball thus allowing it to fall out of contact with the switch blade thereby opening the switch and disengaging the motor which is used to drive the tuning shaft. By initially rotating the tuning shaft manually so that it is in a desired setting, then rotating the ring relative to the shaft so that the corresponding ball falls into the notch of the ring, and then locking the ring to the shaft, the tuner is arranged so that the shaft will be stopped whenever it rotates to the particular position again and the desired setting accurately duplicated.

A further feature is the provision of a tuner having a plurality of spring wedge discs spaced along and adapted to rotate with a tuning shaft and cooperating with the aforesaid notched rings to lock them to the shaft after the rings have been suitably positioned with respect to their corresponding balls as previously explained. Each disc has a pair of tines adapted for radial movement to press the outer edge of the disc against its surrounding ring and thus locking it against the ring and in turn locking the ring to the shaft so that the ring and shaft rotate together.

Still another feature of the invention is a provision of a tuner having a tubular drive sleeve fitting around a serrated length of the tuning shaft and having a pair of longitudinal slots to permit the spring wedge discs to be locked and unlocked by axial movement of the tuning shaft. The tines of the discs extend into the slots and are pushed outward radially by contact with the wide portions or teeth of the shaft. In this manner the spring wedged discs can be locked and released separately and thus the rings associated with them adjusted independently of one another. This in turn permits the selector portion of the device to be adjusted for one particular setting without disturbing any of the other predetermined settings.

In accordance with a specific embodiment of the invention, control apparatus for tuning a television receiver or the like includes a two-speed manual tuning arrangement for accurately rotating a tuning shaft into desired positions and a selector switch controlling a tuning motor for duplicating the desired positions of the shaft. The tuning shaft cooperates through a pair of balls and camming surfaces of a driving collar with a sun gear-planetary gear arrangement which permits slow rotation of the shaft for fine tuning. The collar is provided with a stop pin which cooperates with a slot in an adjacent rotatable plate keyed to the tuning shaft on which the planetary gears are carried so that the plate is driven directly by the collar after a predetermined amount of rotation thereof. This disengages the sun gear-planetary gear system and permits rapid rotation of the tuning shaft. The camming surfaces and balls are arranged to reengage the speed reducing gear each time the direction of rotation of the driving collar is reversed, thus permitting fine back tuning after an approximate setting has been reached.

The selector portion of the control apparatus includes a plurality of spring wedge discs positioned along the length of a tubular sleeve inside of which the tuning shaft is positioned. The tuning shaft is connected to and controls suitable tuning means such as condensers. Each disc is adapted to lock against a corresponding indexing ring and can be locked to the tuning shaft for rotation therewith. A notch on the periphery of each indexing ring cooperates with switch opening means to cut off power from a motor rotating the tuning shaft when the disc is rotated to a predetermined angular position.

In setting the selector mechanism, the receiver of which it is a part is manually tuned to the various settings desired and with each successive setting, one of the rings is tuned to its switch opening position. Each ring is then locked to the tuning shaft for rotation therewith. Each time the shaft is rotated to a switch opening position during automatic tuning, the motor is disengaged and the tuning means stopped at the desired position. Since the indexing rings can be adjusted independently to make any combination of angular positions of the tuning shaft switch opening positions, the selector is extremely flexible in its application.

Figures 1, 2:
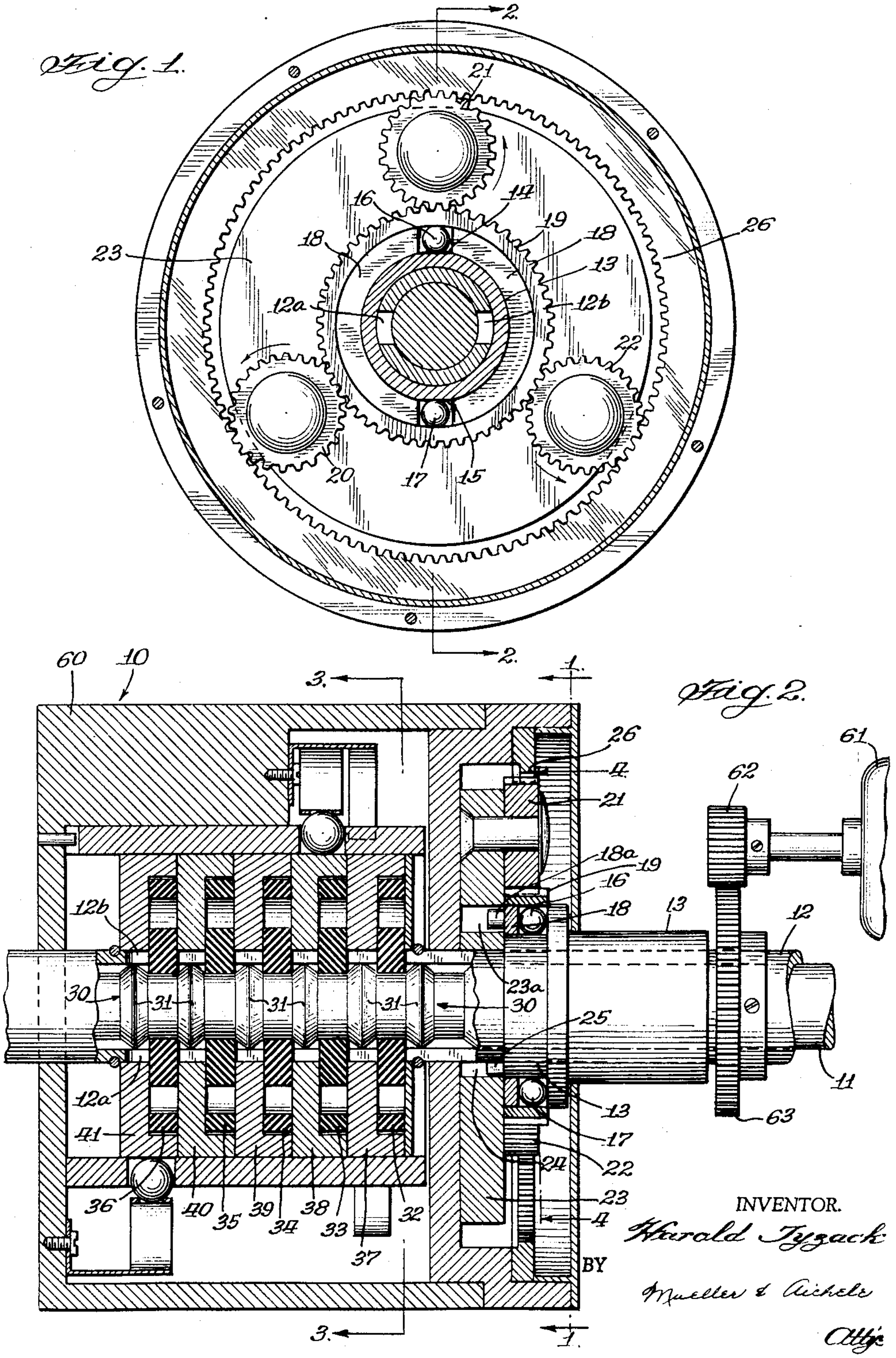
Fig. 1 is a view in section taken through one end of the control apparatus of the present invention and showing the arrangement of the sun and planetary gears used in the fine tuning operation.
Fig. 2 is a view in section taken on the line 2—2 of Fig. 1 and showing the selector switch mechanism included in the apparatus and associated with the two-speed drive.

Referring now particularly to the drawings, the control device generally indicated at 10 (Fig. 2) includes a tuning shaft 11 which fits inside a drive sleeve 12 which sleeve passes through the device and is connected to suitable tuning means not shown. The tuning shaft 11 and the drive sleeve 12 rotate together. A gear 63 is positioned for turning the shaft 11 and is connected to suitable motor means 61 through gear 62 for use in remote control tuning. A collar 13 rides freely on sleeve 12 and is used in manual tuning of the receiver in setting up the tuning selector controls. As shown in Fig. 1, the collar 13 is provided with a pair of flat camming surfaces 14 and 15 for balls 16 and 17 respectively. The balls are held within pockets cored out of retainer ring 18. Annular sun gear 19 fits around the ball retainer 18 and in turn meshes with planetary gears 20, 21, and 22. These planetary gears are rotatably mounted on the plate 23. Each of the planetary gears is free to rotate about its own axis. The plate 23 is provided with an arcuate slot 24 (see Fig. 4) into which is fitted a pin 25 which is integral with the driving collar 13. The plate 23 is keyed to sleeve 12 so that it rotates the sleeve and the tuning shaft 11. The planetary gears are held between the sun gear 19 and the circumferential track 26 on plate 23 which is provided with suitable teeth meshing with the teeth of the planetary gears.

Figure 4:
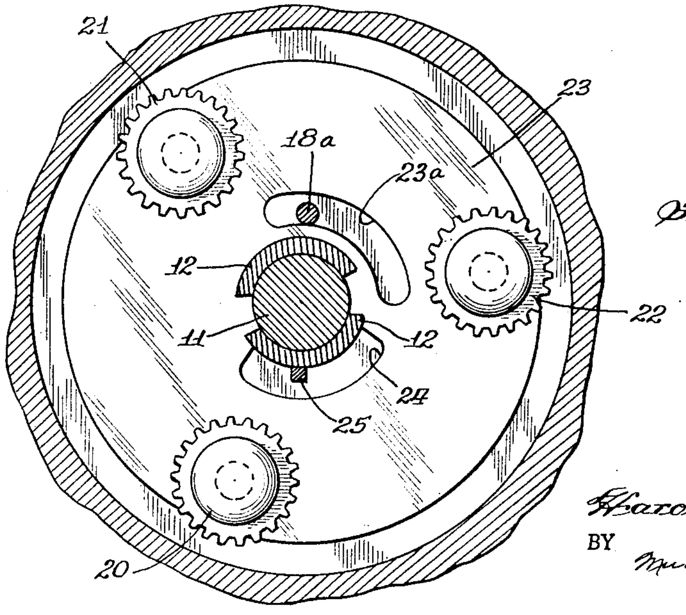
Fig. 4 is a view in section taken on the line 4—4 of Fig. 2.

In the positions shown in Figs. 1 and 4, the camming surface 14 locks the ball 16 against the inner surface of sun gear 19. Rotation of the collar 13, which rides freely on the driving sleeve 12, causes the sun gear 19 to rotate in a clockwise direction as shown and causes the planetary gears 20—22 to rotate counterclockwise. Because of the ratio between the diameters of the sun gear and the planetary gears, plate 23 rotates in a clockwise direction but at a slower speed than that of the driving collar 13 and thus turns sleeve 12 and shaft 11 at reduced speed. This permits fine adjustment of the tuning means connected to the shaft. Because of the difference in the speed of rotation between the collar 13 and the plate 23, the pin 25 moves through the arcuate slot 24 until it reaches the end of the slot. At this point, the rotation of the collar 13 is transmitted directly to the plate 23 which in turn increases the speed of rotation of the planetary gears 20—22. This increase in rotary speed of the planetary gears causes the speed of rotation of the sun gear to increase also. Due to the fact that the speed of rotation of the periphery of the collar 13 and the inner periphery of the sun gear 19 are no longer identical, with the speed of rotation of the sun gear 19 being greater, the ball 16 is rolled out of its locked position and allows the sun gear 19 to become disengaged from the collar 13. In order that the increased speed of the sun gear will release the locked ball and not allow the opposite ball to roll into locked position, plate 23 is provided with arcuate slot 23*a* to accommodate pin 18*a* integral with ball retainer 18. The amount of movement of the balls 16 and 17 when rolling into and out of locking position is thereby restricted. The plate 23 rotates at the same speed as collar 13 and will continue to be so as long as the collar is rotated in a clockwise direction. However, as soon as the direction of rotation is reversed, the surface 15 locks against the ball 17 thus reengaging the sun gear and reduces the speed of the plate 23 and thus of the tuning shaft. The camming surfaces 14 and 15 are spaced slightly less than 180° apart to permit bidirectional operation. The low speed drive continues until the pin 25 has moved back to the opposite end of the arcuate slot 24 to roll the ball 17 out of its locked position and cause the mechanism to revert to direct high speed drive. Thus, it can be seen that when it is desired to make a particular tuning, setting the high speed direct drive is used to turn the tuning shaft to the desired position and in practice may turn it a little past the most precise setting. The direction of rotation is then reversed and the mechanism instantly reverts to the low speed fine tuning drive for the attainment of the precise setting. This driving system does not include the addition of a substantial amount of torsional drag to the tuning mechanism in switching from high speed drive to low speed drive.

The tuning selector portion of the control apparatus is set up for automatic selection by first manually setting the tuning shaft in an angular position that will receive a particular signal and adjusting one of the indexing rings so that it will open a switch and stop the driving motor each time the tuning shaft is in the same angular position with manual tuning.

Figure 3:
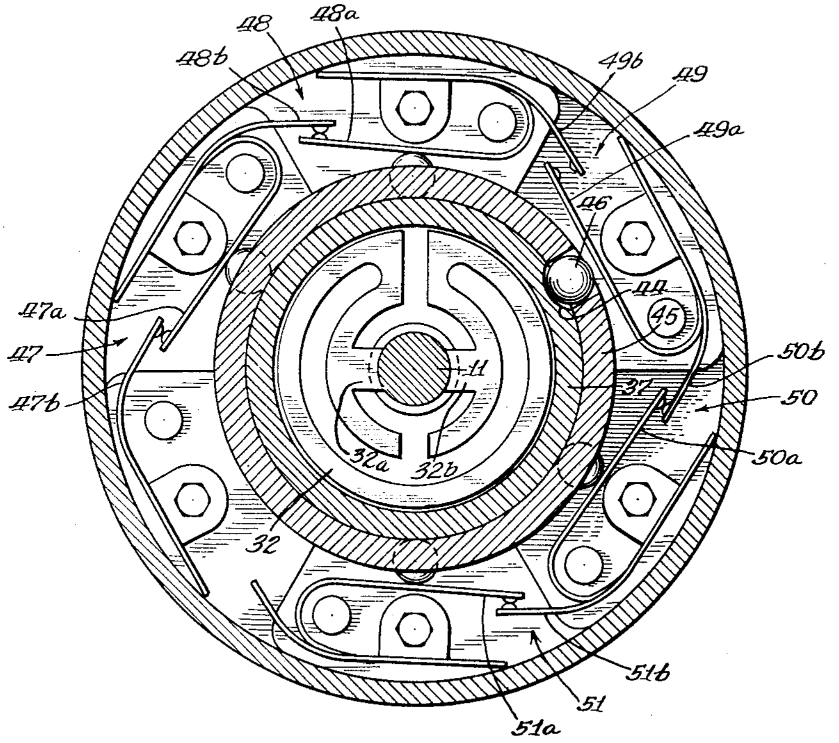
Fig. 3 is a view in section taken on the line 3—3 of Fig. 2.

In accordance with one embodiment of the present invention, the tuning shaft 11 is provided with a serrated portion indicated generally at 30 in Fig. 2 which includes a plurality of spaced camming teeth 31. Camming teeth 31 rest against the inner surface of the drive sleeve 12 so that the sleeve and the shaft rotate together. The shaft 11 may be moved axially through the sleeve 12. Spaced along the serrated portion of the tuning shaft are a plurality of spring wedge discs indicated by the reference characters 32—36 respectively. Fig. 3 shows one of these spring discs 32 in its unlocked position. The discs are made of a suitable resilient material such as hard rubber. Each of the discs is provided with a pair of tines such as 32*a* and 32*b* which fit into longitudinal slots 12*a* and 12*b* respectively of sleeve 12 (see Fig. 2). The resilience of the disc 32 enables it to expand radially in response to outward pressure on the tines 32*a* and 32*b*. Surrounding each of the spring discs is an indexing member in the form of a ring which rings are numbered 37 through 41 respectively. For example, as shown in Fig. 3 the disc 32 is adapted for expansion against ring 37 so that the ring will rotate with rotation of the spring disc. Each of the rings is provided with a notch, such as notch 44 of ring 37. A retainer such as 45 is positioned around each ring and is provided with appropriately placed slots to hold balls such as 46 adjacent the switches of the device. A plurality of switches numbered 47 through 51 are angularly and axially spaced from one another along and around the tuning shaft. Each switch includes a flexible switch blade which blades are numbered 47*a* through 51*a* respectively. Each blade serves as a moving contact and is adapted to engage a corresponding fixed contact numbered 47*b* through 51*b* respectively. The fixed and moving contacts are arranged in sets with the fixed contact of a particular switch positioned with the moving contact of the next adjacent switch. These sets are axially and angularly spaced from one another with the moving contact being broad enough to engage the fixed contact of the adjacent set. In Fig. 3 all of the flexible blades are shown engaging their corresponding fixed contacts except for the blade 49*a* which is out of engagement with contact 49*b*. The other blades are all held against their corresponding contacts by the corresponding balls. However, the ball 46 is shown as resting in the notch 44 of the indexing ring 37. The radial displacement of the ball 44 from the outer periphery of ring 37 to the notch 44 permits movement of blade 49*a* away from contact 49*b*.

Figure 5:
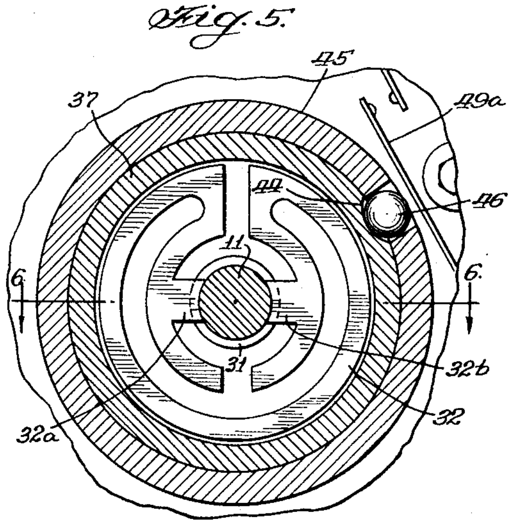
Fig. 5 is a view in section taken through one of the spring wedge and ring assemblies showing the ring and wedge in the unlocked position for setting of the ring.

In setting up the selector device so that it will reproduce desired angular positions of the tuning shaft 11 which corresponds to predetermined tuning settings, it is first necessary to manually tune the setting desired. By manual rotation of the collar 13 and utilizing the fine tuning mechanism previously described, the shaft 11 can be accurately set in the desired angular position. Indexing ring 37 (the one nearest the manual tuning means) is then manually rotated to the position shown in Figs. 3 and 5 so that its notch 44 will register with the ball 45 thus causing a radial movement of the ball whereby it falls out of contact with flexible plate 49*a* and opens switch 49. Access can be gained to the various indexing members for manually positioning them by removing the cover member 60 of the unit.

Figure 7:
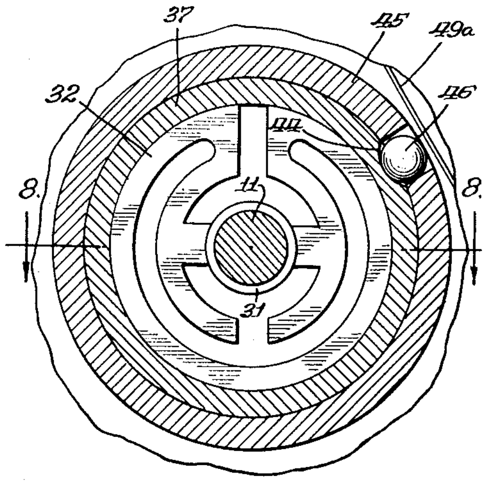
Fig. 7 is a view similar to Fig. 5 but showing the spring wedge disc locked against the ring.
Figure 6:
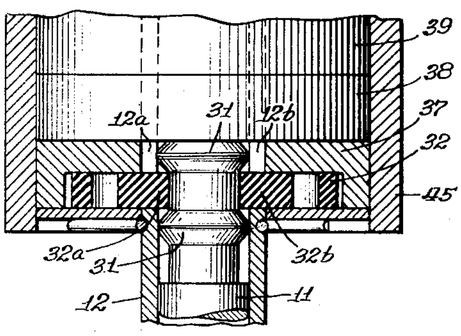
Fig. 6 is a partial view in section taken on the line 6—6 of Fig. 5.
Figure 8:
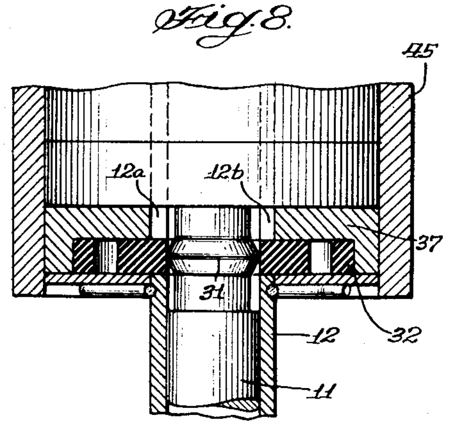
Fig. 8 is a view partially in section taken on the line 8—8 of Fig. 7.

Once the ring 37 has been set in position, the corresponding wedge disc 32 which was in the unlocked position shown in Fig. 6 is expanded to its locking position. This is done by axial movement of the serrated portion 30 of tuning shaft 11 so that one of the teeth 31 engages the tines 32*a* and 32*b* of the disc 32 as shown in Figs. 7 and 8 expanding the disc into driving relation with the ring 37.

Further rotation of the shaft 11 will turn the disc 32 and the ring 37 thus moving the ball 46 out of notch 44 and into contact with blade 49*a* thus closing the switch 49 and holding it closed until ring 37 is turned to its switch opening position in which its notch is in registry with the ball 46. At this point, the ball 46 will fall into the notch and open switch 49.

The other rings 38—41 are set for particular angular positions of the tuning shaft in the same manner by progressively moving the serrated portion of the shaft to bring one of the teeth 31 against the corresponding ring after it has been set in the desired position, that is, with its notch in registry with the corresponding ball when the tuning shaft 11 is in a desired position.

Figure 9:
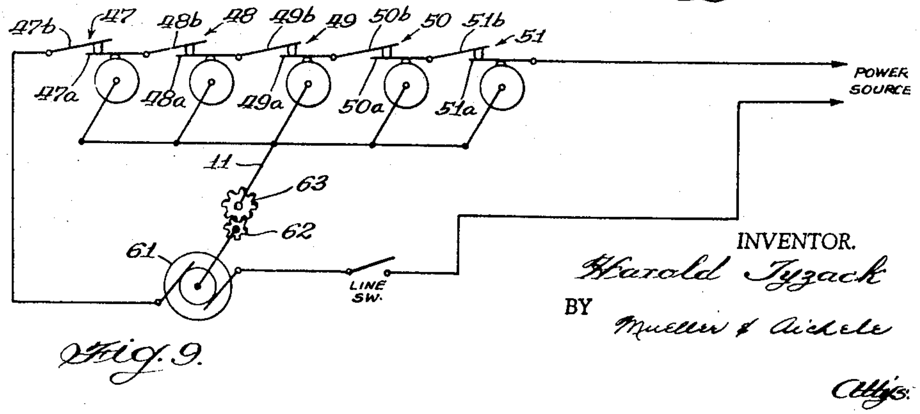
Fig. 9 is a schematic representation of the electrical connection between a driving motor and the selector switch mechanism.

As shown in Fig. 9, switches 47—51 are electrically connected in series so that the opening of any one of them will break circuit with motor 61 which turns the gear 62 which in turn engages the gear 63 to drive the tuning shaft 11. When the present invention is used in automatic tuning so that the shaft 11 is turned by the motor 61, selection of a desired setting takes place when one of the indexing rings which has been locked to the shaft by its corresponding spring disc is turned to such a position where it opens its corresponding switch thus effectively disconnecting motor 61 and stopping rotation of shaft 11 in the desired position.

In setting these various indexing rings in position, the serrated portion of the shaft 11 is moved progressively from right to left on Fig. 2 so that the rings 37—41 may be set separately and independently of one another. In the position shown in Fig. 2, all the rings will be locked to their discs by movement of the serrated portion 30 one position to right or left. It is possible to provide for predetermined settings as close together or as far apart as is desirable under the circumstances in which the particular selector is employed due to the independent adjustability of each ring. In addition, it is possible to readjust the selector in such a manner as to change only one of the settings by adjusting the position of one of the indexing rings without disturbing the setting of the others.

Instead of locking the index rings in position by means of the teeth illustrated, the shaft 11 may be provided with a circumferential depressed portion which may be moved axially to successively unlock the spring discs, the major diameter of the shaft at this portion being such as to hold the discs in locked position.

The present invention provides a mechanism for accurately rotating a tuning shaft to a predetermined position, and means for accurately reproducing this position when the tuning shaft is driven by means of a motor. The two-speed manual drive permits rapid and accurate preselection of a tuning setting and the selector means enables duplication of a number of separate settings which can be closely and irregularly spaced from one another to any extent necessary. In this way, a receiver can be readily adjusted for the reception and automatic tuning of channels available in a particular area and capable of quick and simple readjustment.

I claim:

1. Control apparatus for tuning electronic equipment manually, and operable by a motor for tuning such equipment automatically, said apparatus including in combination, a rotatable tuning shaft, manual drive means, gear means cooperating with said shaft and said drive means to permit accurate manual positioning of said shaft in a plurality of angular positions corresponding to tuning settings, a plurality of switch means connected to said motor means and spaced axially along said shaft, a plurality of indexing rings spaced axially along said shaft in positions corresponding to said switch means, each ring having a notch on its periphery and being adapted for rotation independent of said shaft to a predetermined angular position, balls held between each switch means and the periphery of its corresponding indexing ring and adapted to be held in contact with said switch, each of said balls adapted to move into the notch of its corresponding ring when said notch is in registry therewith thererby operating said switch means to deactivate the motor and stop said tuning shaft in a predetermined angular position corresponding to a tuning setting, a plurality of radially expandable discs each carried on said shaft, each in alignment with one of said indexing rings and adapted for expansion against said ring to affix it to said shaft for rotation therewith, said shaft including a slotted sleeve portion and a serrated portion axially movable inside said sleeve portion, the teeth of said serrated portion adapted to engage said discs and to force them radially against their corresponding indexing rings to affix the said rings to said shaft for rotation therewith.

2. Control apparatus for tuning electronic equipment, said apparatus including in combination, a rotatable tuning shaft, a manually rotatable collar around said shaft, an annular sun gear around said collar, a camming surface on said collar, ball means for cooperating with said camming surface to hold said gear to said collar, a driven plate rigidly affixed to said shaft, a planetary gear adapted to be driven by said sun gear and carried on said plate, an arcuate slot formed in said plate, a pin carried on said collar fitting into said slot for driving said plate directly through said collar at the speed of rotation thereof when said pin engages the ends of said slot, with said plate being driven by said collar at a speed slower than the speed of rotation of said collar through said sun gear and said planetary gear when said pin is intermediate the ends of said slot to facilitate accurate angular positioning of said shaft, whereby said control apparatus is operable to tune the equipment approximately at one speed and to fine tune the equipment accurately at a slower speed.

3. Control apparatus for tuning electronic equipment manually and operable by a motor for tuning such equipment automatically, said apparatus including in combination, a rotatable tuning shaft, manually operated positioning means for accurately setting said shaft in predetermined angular positions corresponding to tuning settings, said positioning means including a manually rotatable collar riding freely on said shaft, an annular sun gear around said shaft, a camming surface on said collar, ball means cooperating with said camming surface for holding said collar in driving relation to said sun gear, a driven plate rigidly affixed to said shaft, a planetary gear adapted to be driven by said sun gear and carried on said plate so that rotation of said collar when in driving relation to said sun gear effects reduced speed rotation of said shaft for accurate positioning thereof, an arcuate slot formed in said plate, a pin carried on said collar fitting in said slot, said pin adapted to engage said plate at the ends of said slot to put said plate into directly driven relation with said collar and to release said collar from driving relation to said sun gear, said apparatus further including a plurality of indexing members axially spaced along said shaft with each of said indexing members adapted to be affixed to said shaft for rotation therewith when said shaft has been manually positioned to a desired setting, and a switch corresponding to each indexing member, said indexing member and switches cooperating to disconnect the motor upon duplication of each of said desired settings.

4. Control apparatus for tuning electronic equipment manually, and operable by a motor for tuning such equipment automatically, said apparatus including in combination, a rotatable and axially movable tuning shaft operable manually and operatively connected to the motor for rotation thereby, a plurality of switch means for controlling the motor spaced axially along said shaft, a plurality of indexing devices associated with respective ones of said switch means on said shaft and spaced axially therealong in positions corresponding to said switch means, said indexing devices each having an actuating portion for operating the associated switch means to deactivate the motor when said device is in a predetermined angular position, and locking means operable by axial movement of said shaft in one direction to couple said indexing devices to said shaft for rotation therewith and operable by axial movement of said shaft in the opposite direction to uncouple said indexing devices from said shaft to permit relative rotation therebetween, whereby said indexing devices and said shaft may be set in selected angular positions with respect to each othere to operate the associated switch means at predetermined tuning positions of said shaft, thereby deactivating the motor and stopping rotation of said shaft.

5. Control apparatus for tuning electronic equipment manually, and operable by a motor for tuning such equipment automatically, said apparatus including in combination, a rotatable and axially movable tuning shaft operable manually and operatively connected to the motor for rotation thereby, a plurality of switch means for controlling the motor and spaced axially along said shaft, a plurality of indexing devices associated with respective ones of said switch means and spaced axially along said shaft in positions corresponding to said switch means, said indexing devices each having an actuating portion for operating the associated switch means to deactivate the motor when said device is in a predetermined rotary position, resilient wedge means frictionally engageable with said indexing devices, and cam means on said shaft frictionally engageable with said wedge means upon axial movement of said shaft in one direction to engage said wedge means with said indexing devices thereby coupling the same to said shaft for rotation therewith, with axial movement of said shaft in the opposite direction disengaging said cam means and said wedge means thereby uncoupling said indexing devices from said shaft to permit relative rotation therebetween, whereby said indexing devices and said shaft may be set in selected positions with respect to each other to operate the associated switch means at predetermined positions of said shaft thereby deactivating the motor and stopping rotation of said shaft.

6. Control apparatus for tuning electronic equipment manually and operable by a motor for tuning such equipment automatically, said apparatus including in combination, a rotatable and axially movable tuning shaft operable manually and operatively connected to the motor for rotation thereby, a plurality of switch means for controlling the motor and spaced axially along said shaft, a plurality of indexing rings associated with respective ones of said switch means and spaced axially along said shaft in positions corresponding to said switch means, said indexing rings each having an actuating portion for operating the associated switch means to deactivate the motor when said ring is in a predetermined rotary position, a plurality of radially expandable resilient discs associated with respective ones of said indexing rings and frictionally engageable therewith upon expansion, a plurality of cam projections on said shaft frictionally engageable with respective ones of said discs to expand the same upon axial movement of said shaft in one direction and thereby engage said discs with said indexing rings coupling the same to said shaft for rotation therewith, with axial movement of said shaft in the opposite direction disengaging said cam means and said discs thereby uncoupling said indexing rings from said shaft to permit relative rotation therebetween, whereby said indexing devices and said shaft may be set in selected angular positions with respect to each other to operate the associated switch means at predetermined tuning positions of said shaft thereby deactivating the motor and stopping rotation of said shaft.

7. Control apparatus for tuning electronic equipment manually and operable by a motor for tuning such equipment automatically, said apparatus including in combination, a rotatable and axially movable tuning shaft operable manually and operatively connected to the motor for rotation thereby, a plate rigidly secured to said shaft for rotating the same, manual drive means rotatable with respect to said plate through a predetermined range of rotary movement, said drive means having a connecting member engageable with said plate at the extremes of the aforesaid range for directly rotating said plate at the speed of rotation of said drive means and thereby rotating said shaft, gear means coupling said drive means to said plate and operative to rotate said plate and said tuning shaft at a slower speed than the speed of rotation of said drive means, clutch means interconnecting said gear means and said drive means for transmitting rotary movement of said drive means within the aforesaid range to said gear means and for effectively uncoupling said gear means and said drive means during rotation of said drive means beyond the extremes of such range, whereby said drive means is operable to set said shaft at exact angular positions corresponding to tuning settings, a plurality of switch means for controlling the motor and spaced axially along said shaft, a plurality of indexing devices associated with respective ones of said switch means and spaced axially along said shaft in positions corresponding to said switch means, said indexing devices each having an actuating portion for operating the associated switch means to deactivate the motor when said device is in a predetermined angular position, and locking means operable by axial movement of said shaft in one direction to couple said indexing devices to said shaft for rotation therewith and operable by axial movement of said shaft in the opposite direction to uncouple said indexing devices from said shaft to permit relative rotation therebetween, whereby said indexing devices and said shaft may be set in selected angular positions with respect to each other to operate the associated switch means at predetermined tuning positions of said shaft thereby deactivating the motor and stopping rotation of said shaft.

References Cited in the file of this patent

UNITED STATES PATENTS

| | | |
|---|---|---|
| 2,557,896 | Soule et al. | June 19, 1951 |
| 2,581,804 | Marx | Jan. 8, 1952 |
| 2,711,448 | Shuvmon et al. | June 21, 1955 |
| 2,793,258 | Engelage | May 21, 1957 |